(12) United States Patent
Tokiwa et al.

(10) Patent No.: US 7,817,457 B2
(45) Date of Patent: Oct. 19, 2010

(54) NON-VOLATILE MEMORY DEVICE

(75) Inventors: Naoya Tokiwa, Fujisawa (JP); Kazushige Kanda, Kawasaki (JP); Toshiaki Edahiro, Yokohama (JP); Koji Hosono, Fujisawa (JP); Takuya Futatsuyama, Yokohama (JP); Shigeo Ohshima, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 212 days.

(21) Appl. No.: 12/132,972

(22) Filed: Jun. 4, 2008

(65) Prior Publication Data

US 2009/0010039 A1  Jan. 8, 2009

(30) Foreign Application Priority Data

Jun. 4, 2007  (JP)  ............................. 2007-147817

(51) Int. Cl.
*G11C 11/00*  (2006.01)
(52) U.S. Cl. .................. 365/148; 365/163; 365/189.05
(58) Field of Classification Search ................. 365/148, 365/163, 189.05
See application file for complete search history.

(56) References Cited

U.S. PATENT DOCUMENTS

| 6,075,719 | A | 6/2000 | Lowrey et al. |
| 6,831,854 | B2 | 12/2004 | Rinerson et al. |
| 7,286,382 | B1 * | 10/2007 | Vadi et al. .............. 365/189.15 |
| 7,471,556 | B2 * | 12/2008 | Chow et al. .................. 365/163 |

FOREIGN PATENT DOCUMENTS

| JP | 10-79197 | 3/1998 |
| JP | 11-345494 | 12/1999 |
| JP | 2004-355676 | 12/2004 |
| JP | 2006-344349 | 12/2006 |

OTHER PUBLICATIONS

U.S. Appl. No. 12/266,884, filed Nov. 7, 2008, Tokiwa.
U.S. Appl. No. 12/394,487, filed Feb. 27, 2009, Tokiwa, et al.
Y. Hosoi, et al., "High Speed Unipolar Switching Resistance RAM (RRAM) Technology", Technical Digest, IEEE International Electron Devices Meeting 2006, 4 pages.

* cited by examiner

*Primary Examiner*—Huan Hoang
(74) *Attorney, Agent, or Firm*—Oblon, Spivak, McClelland, Maier & Neustadt, L.L.P.

(57) ABSTRACT

According to one embodiment, a nonvolatile memory device includes: a memory cell array including memory cells each having a variable resistance element for nonvolatilely storing data identified by an electrically rewritable resistance value; a first data latch storing write and erase data to be written on a given group of memory cells of the memory cell array for a write and erase operation; and a second data latch storing reference data for performing a compensation operation of the given group to compensate write and erase disturbance accompanied by the write or erase operation.

11 Claims, 13 Drawing Sheets

FIG. 16A WRITE DATA → FIRST DATA LATCH 16  (1: RESET, 0: SET)

| b0 | b1 | b2 | b3 | b4 | b5 | b6 | b7 | b8 | b9 | b10 | b11 | b12 | b13 | b14 | b15 |
|----|----|----|----|----|----|----|----|----|----|-----|-----|-----|-----|-----|-----|
| 0  | 0  | 0  | 0  | 0  | 0  | 0  | 0  | 1  | 0  | 1   | 0   | 0   | 1   | 0   | 1   |

FIG. 16B READ-OUT DATA → SECOND DATA LATCH 19  (1: RESET STATE, 0: SET STATE)

| 1 | 0 | 1 | 0 | 0 | 0 | 0 | 0 | 0 | 1 | 0 | 1 | 1 | 1 | 1 | 1 |
|---|---|---|---|---|---|---|---|---|---|---|---|---|---|---|---|

FIG. 16C OUTPUT OF WRITE DRIVER 17  (1: RESET, 0: SET, *: SET/RESET PROHIBITION)

| 0 | * | 0 | * | * | * | * | * | 1 | 0 | 1 | 0 | 0 | * | 0 | * |
|---|---|---|---|---|---|---|---|---|---|---|---|---|---|---|---|

| | b0 | b1 | b2 | b3 | b4 | b5 | b6 | b7 | b8 | b9 | b10 | b11 | b12 | b13 | b14 | b15 | |
|---|---|---|---|---|---|---|---|---|---|---|---|---|---|---|---|---|---|
| FIG. 17A CELL DATA BEFORE WRITE | 1 | 1 | 1 | 1 | 1 | 1 | 1 | 1 | 1 | 1 | 1 | 1 | 1 | 1 | 1 | 1 | (1: RESET STATE, 0: SET STATE) |
| FIG. 17B EVEN-ADDRESS WRITE DATA → FIRST DATA LATCH 16 | 1 | x | 1 | x | 0 | x | 0 | x | 1 | x | 0 | x | 0 | x | 1 | x | (1: RESET, 0: SET, x: NON WRITE-TARGET) |
| FIG. 17C ODD-ADDRESS WRITE DATA → FIRST DATA LATCH 16 | x | 0 | x | 0 | x | 0 | x | 0 | x | 1 | x | 1 | x | 1 | x | 1 | (1: RESET, 0: SET, x: NON WRITE-TARGET) |
| FIG. 17D CELL DATA BEFORE ODD-ADDRESS WRITE → SECOND DATA LATCH 19 | 1 | 1 | 1 | 1 | 0 | 1 | 0 | 1 | 1 | 1 | 0 | 1 | 0 | 1 | 1 | 1 | (1: RESET STATE, 0: SET STATE) |
| FIG. 17E CELL DATA AFTER WRITE | 1 | 0 | 1 | 0 | 0 | 0 | 0 | 0 | 1 | 1 | 0 | 1 | 0 | 1 | 1 | 1 | (1: RESET STATE, 0: SET STATE) |

…

NON-VOLATILE MEMORY DEVICE

CROSS-REFERENCE TO RELATED APPLICATIONS

This application is based upon and claims the benefit of priority from Japanese Patent Application No. 2007-147817, filed Jun. 4, 2007, the entire contents of which are incorporated herein by reference.

BACKGROUND OF THE INVENTION

The present invention relates to a non-volatile memory device that stores resistance value information of a variable resistance element, which can be electrically rewritable, in a non-volatile manner.

Recently, as non-volatile memory devices, ReRAMs (Resistive Random Access Memory) that store resistance value information of an electrically-rewritable variable resistance element in a non-volatile manner have been attracted attention, and researches for the memory devices have been actively performed.

The variable resistance element as a memory element of the ReRAM is configured by an electrode/a metal oxide/an electrode. It is known that there are two types of operation principles in the variable resistance element. The operation principle of one type is for shifting between a high-resistance state and a low-resistance state by changing the polarity of an applied voltage, which is referred to as a bipolar type. The operation principle of the other type is for shifting between a high-resistance state and a low-resistance state by controlling the voltage value and the time period of the applied voltage, which is referred to as a non-polar type (or unipolar type).

In order to implement a high-density memory cell array, the unipolar type is preferable. The reason is that, in the unipolar type, a cell array can be configured by superposing a variable resistance element and a rectifying device such as a diode at each cross point of bit lines and word lines without using a transistor.

When the cross-point-type cell array is configured without using a rectifying element, write disturbance occurs for unselected cells due to crosstalk generated in a write operation. In order to reduce the influence, a technique for applying a write compensation voltage to the unselected memory cells after the application of the write voltage has been disclosed in JP-A-2006-344349.

On the other hand, in order to prevent crosstalk in the cross-point-type cell array, a rectifying device such as a diode is superposed with the variable resistance element (for example, see U.S. Pat. No. 6,831,854).

A cross-point-type cell array for which voltages having the same polarity can be used for the write and erase operations and a cross-point-type cell array for which a write operation is performed by using a short pulse and an erase operation is performed by using a long pulse are, for example, disclosed in Y. Hosoi et al, "High Speed Unipolar Switching Resistance RAM (RRAM) Technology" IEEE International Electron Devices Meeting 2006 Technical Digest p. 793~796.

In the ReRAM, when gaps between the bit lines or the word lines decreases for implementing high-density and high integration, write disturbance (or erase disturbance) for unselected memory cells occurs due to capacitive coupling in a write (or erase) operation.

SUMMARY OF THE INVENTION

According to an aspect of the present invention, there is provided a nonvolatile memory device including: a memory cell array including memory cells each having a variable resistance element for nonvolatilely storing data identified by an electrically rewritable resistance value; a first data latch storing write and erase data to be written on a given group of memory cells of the memory cell array for a write and erase operation; and a second data latch storing reference data for performing a compensation operation of the given group to compensate write and erase disturbance accompanied by the write or erase operation.

According to another aspect of the present invention, there is provided a nonvolatile memory device including: a memory cell array including memory cells each having a variable resistance element for nonvolatilely storing data identified by an electrically rewritable resistance value; a first data latch storing a first write data stored in a part of the given group of memory cells, and a second data latch storing a second write data read from the given group of memory cells except the part of the given group of the memory cells, wherein, after the data stored in the given group of the memory cells are collectively erased, the first write data and the second write data are written on each corresponding position of the given group of memory cells.

BRIEF DESCRIPTION OF THE DRAWINGS

A general architecture that implements the various feature of the invention will now be described with reference to the drawings. The drawings and the associated descriptions are provided to illustrate embodiments of the invention and not to limit the scope of the invention.

FIGS. 16(a)-(c) are diagrams showing an operation example of a third write/erase method according to an embodiment.

FIGS. 17(a)-(e) are diagrams showing an operation example of a fourth write/erase method according to an embodiment.

DETAILED DESCRIPTION OF THE PREFERRED EMBODIMENTS

Hereinafter, embodiments of the present invention will be described with reference to the accompanying drawings.

Figure 1:
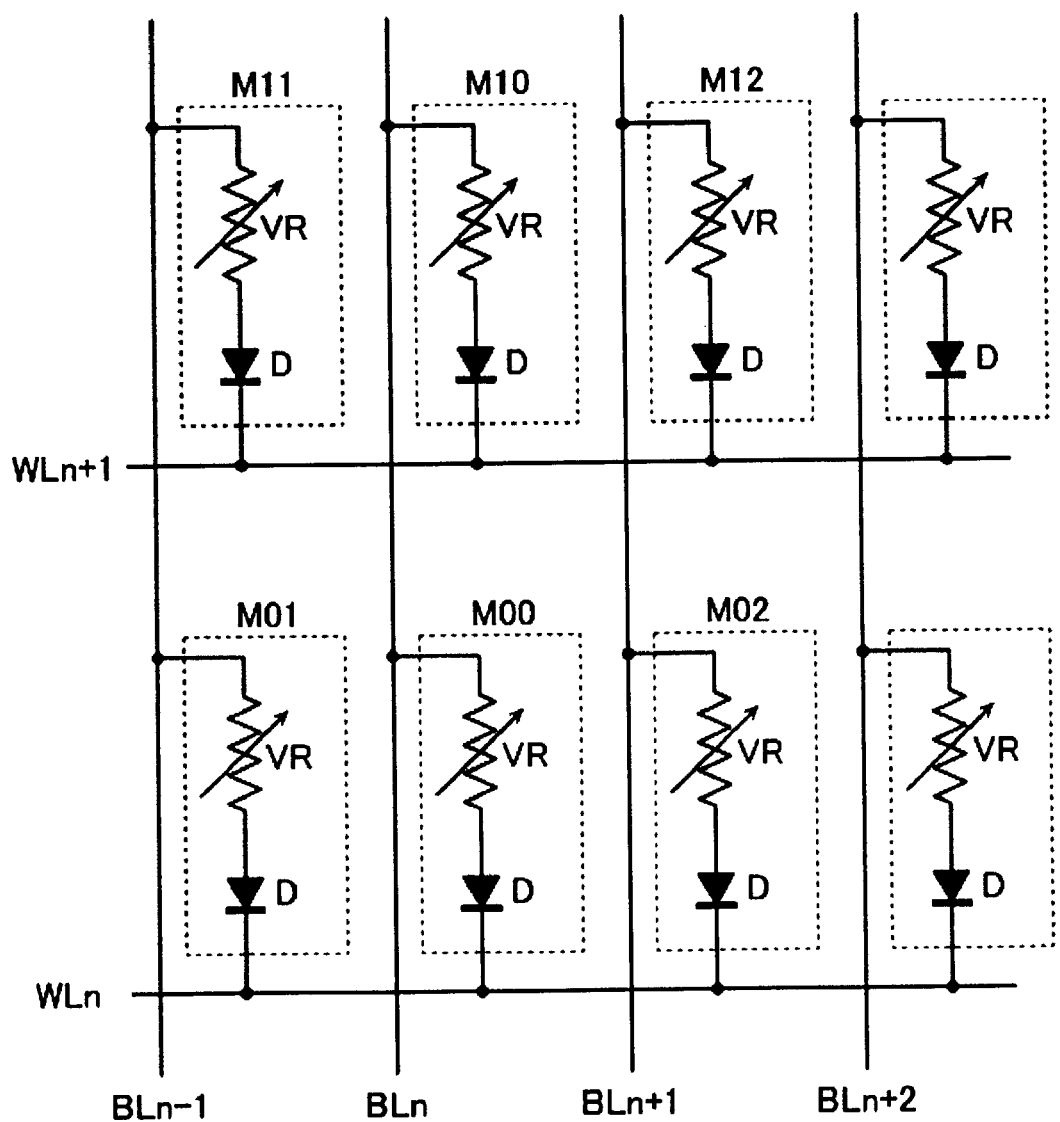
FIG. 1 is a diagram showing an equivalent circuit of a memory cell array of a ReRAM according to an embodiment.

FIG. 1 shows the configuration of a memory cell array of a non-volatile memory according to an embodiment of the present invention. In the memory cell array, wirings (herein after, referred to as word lines) WL extending in the row direction (direction X) and wirings (herein after, referred to as bit lines) BL extending in the column direction (direction Y) which intersecting each other are disposed, and a memory cell in which a variable resistance element VR and a rectifying device D are stacked is disposed at each intersection thereof. In other words, the variable resistor element VR has one end connected to a bit line BL and the other end connected to a word line WL through the rectifying device D.

Figure 2:
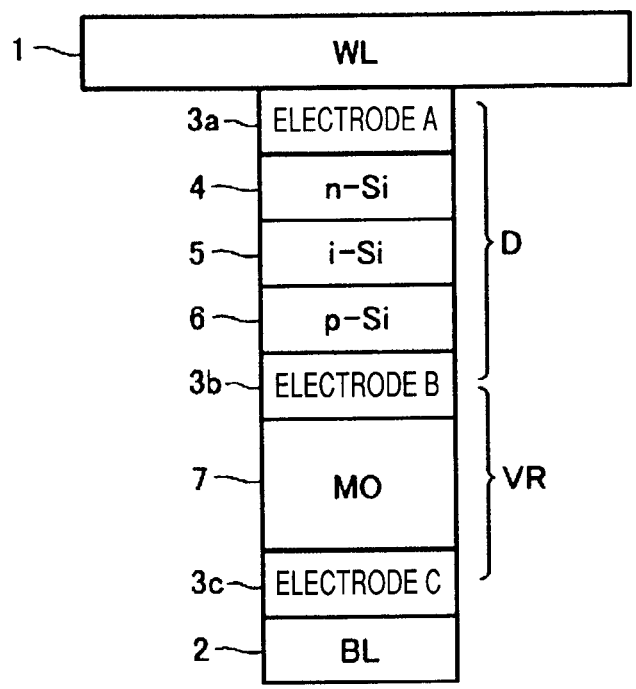
FIG. 2 is a diagram showing the memory cell stacked structure of the memory cell array.
Figure 3:
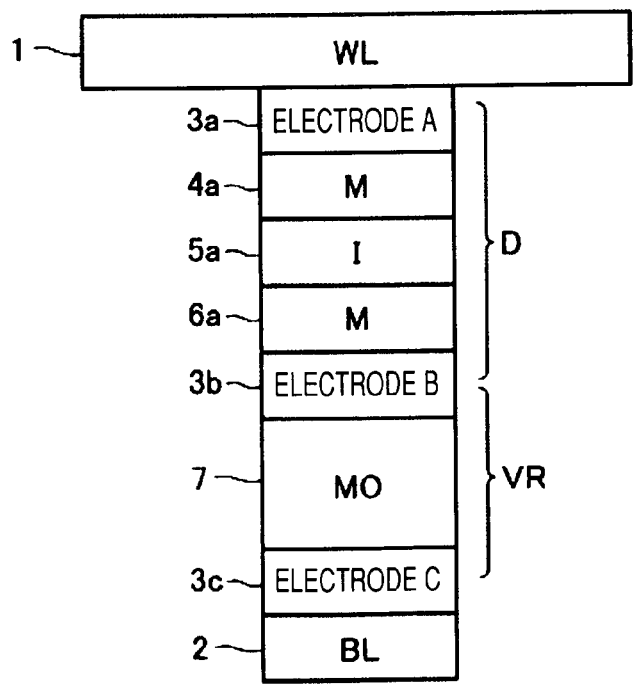
FIG. 3 is a diagram showing the memory cell stacked structure of another memory cell array.

FIGS. 2 and 3 show the stacked structure of the variable resistance element VR and the rectifying device D that constitute the memory cell between the word line (WL) 1 and the bit line (BL) 2. The variable resistance element VR is configured by a metal oxide (MO) film 7 that is interposed between electrodes 3*b* and 3*c*.

In addition, the variable resistance element may include an oxidation compound of Magnesium and Manganese such as $Mg_xMn_yO_z$ ($0 \leq x \leq 1$, $0 \leq y \leq 1$, $0 < z \leq 1$).

The rectifying device D, in the case shown in FIG. 2, is a pin diode formed by an n-type silicon layer 4/an i-type silicon layer 5/a p-type silicon layer 6. In the case shown in FIG. 3, the rectifying device D is an MIM diode using a metal film 4*a*/an insulation film 5*a*/a metal layer 6*a*.

As an electrode 3*a*, a material that can form ohmic contact between the word line (WL) 1 and the rectifying device D is used. As an electrode 3*b*, a material that can form ohmic contact between the rectifying device D and the variable resistance element VR is used. In addition, as an electrode 3*c*, a material that can form ohmic contact between the bit line (BL) 2 and the variable resistance element VR is used.

Figure 4:
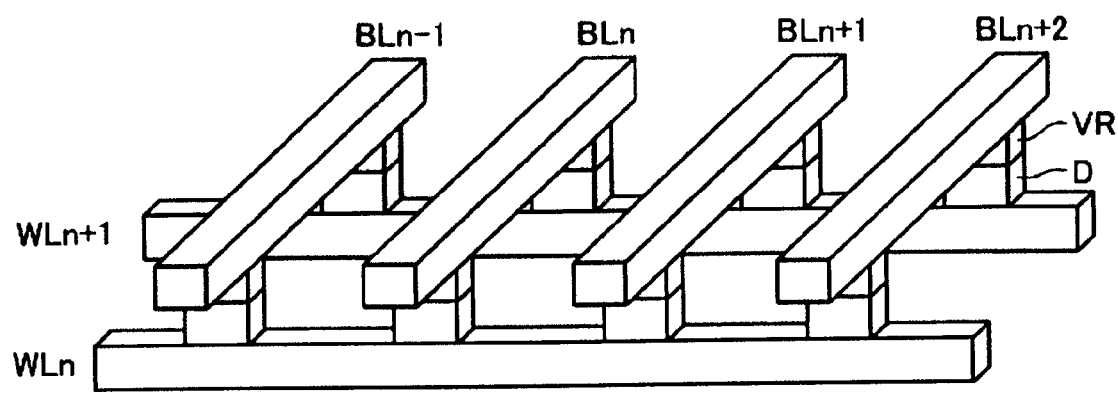
FIG. 4 is a diagram showing a three-dimensional layout of the memory cell array.

FIG. 4 shows the three-dimensional stacked structure of the cell array. In FIG. 4, the structure shown in FIG. 2 is vertically reversed. However, any one between the vertical structures may be used.

Figure 5:
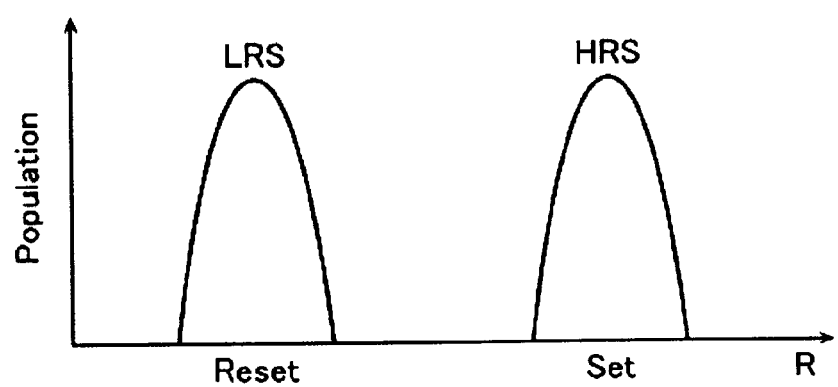
FIG. 5 is a diagram showing a data state of the memory cell.

In this embodiment, the variable resistance element VR, as shown in FIG. 5, has a low-resistance state LRS as a data erasing state and a high-resistance state HRS as a data writing state. In addition, an operation for changing the low-resistance state LRS of a cell to the high-resistance state HRS is defined as a write (or set) operation, and an operation for changing the high-resistance state HRS of a cell to the low-resistance state LRS is defined as an erase (or reset) operation.

Figure 6:
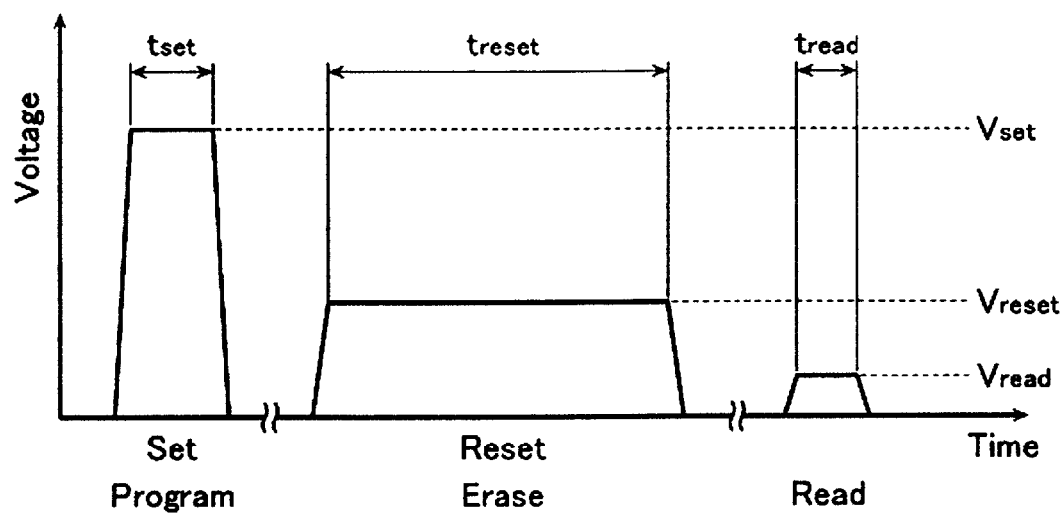
FIG. 6 is a diagram showing waveforms of write, erase, and read-out voltages.

FIG. 6 shows relative voltage waveforms to be applied to the variable resistance element VR for write, erase, and read operations in this embodiment. For data writing, a high write voltage Vset is applied for a short time period tset. Accordingly, the state of the variable resistor element VR becomes the write state HRS of high resistance from the erase state LRS of low resistance.

For data erasing, an erase voltage Vreset that is lower than the write voltage is applied for a time period treset longer than that in a write operation. Accordingly, the state of the variable resistor element VR becomes the erase state LRS of low resistance from the write state HRS of high resistance.

For data reading, a read voltage Vread much lower than the erase voltage which does not change the resistance value is applied for a short time period tread, and accordingly, data is sensed, for example, by detecting a current or a voltage of the bit line.

In particular, in FIG. 1, a case where a write operation for a memory cell M00 selected by a bit line BLn and a word line WLn is performed will now be described. At this moment, for example, a write bit line voltage of 7 V is applied to the selected bit line BLn, and a write word line voltage of 0 V is applied to the selected word line WLn. Accordingly, the rectifying device D of the selected memory cell M00 is forward-biased, and a write voltage Vset required for the variable resistance element VR is applied.

0 V is applied to unselected bit lines $BL_{n-1}$ and $BL_{n+1}$, and a write blocking voltage of 7 V is applied to an unselected word line $WL_{n+1}$. Accordingly, voltage potential is not applied to unselected memory cells M01, M02 which are located on the same word line WLn as the selected memory cell M00. Therefore, the resistance value is not varied.

And, a voltage level is not applied to unselected memory cell M10 which is located on the same bit line BLn as the selected memory cell M00. Therefore, the resistance value is not varied. The rectifying devices D of memory cells M11 and M12 located at the intersections of unselected bit lines and unselected word lines are reverse-biased, and accordingly, the states of the variable resistance elements VR are not changed.

Here, although a writing method using a constant voltage is considered, however, a writing method using a static current can be used.

By using bias as described above, a bit-selection write operation can be performed. However, when the cell array is miniaturized, in the adjacent memory cells M01 and M02 that share a word line with the selected memory cell M00, the electric potentials of the unselected bit lines $BL_{n-1}$ and $BL_{n+1}$ adjacent to the selected bit line BLn momentarily increase due to capacitive coupling between the bit lines, and accordingly, the adjacent memory cells become a weak write state. Depending on the voltage level and time period of the weak write state, there is a possibility that write disturbance, which is not negligible, occurs.

Figure 7:
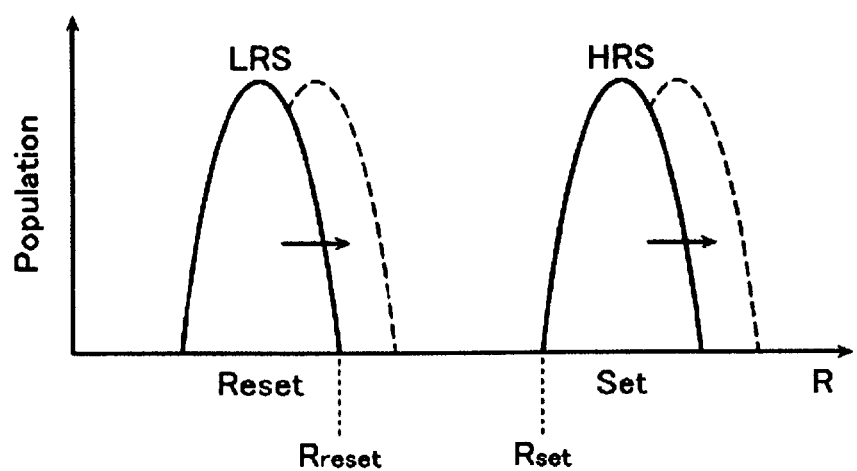
FIG. 7 is a diagram showing a change in the data state due to write disturbance.

FIG. 7 shows the distribution of data resistance values denoted by a broken line together with an ideal state (solid line) for a case where the above-described write disturbance is considered. In other words, the data state is shifted to a higher resistance value side in accordance with the write disturbance.

The data erasing operation by selecting a bit is performed similar to the data writing operation with only the voltage level and the voltage applying time period changed. In this operation, unselected adjacent cells (M01 and M02) that are located on a same word line WLn as the selected memory cell become a weak erase state due to the capacitive coupling between bit lines. Accordingly, depending on the voltage level and time period of the weak erase state, there is a possibility that erase disturbance, which is not negligible, occurs.

Figure 8:
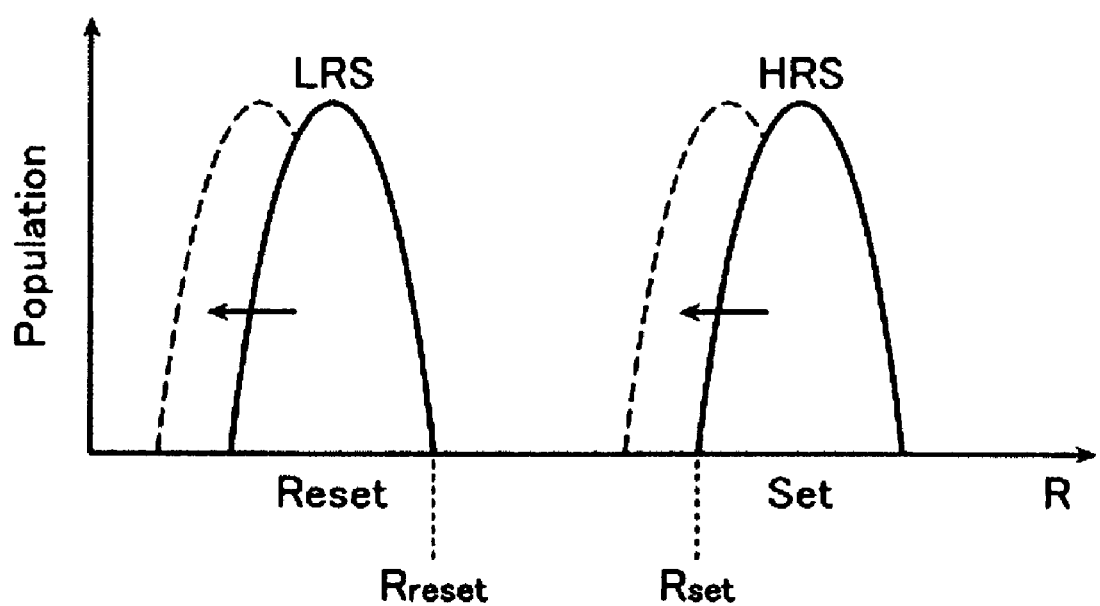
FIG. 8 is a diagram showing a change in the data state due to erase disturbance.

FIG. 8 shows the distribution of data resistance values denoted by a broken line together with an ideal state (solid line) for a case where the above-described erase disturbance is considered. In other words, the data state is shifted to a lower resistance value side in accordance with the erase disturbance.

In addition, although not shown in the figure, for a read operation, there may be a case where read disturbance for unselected cells become a problem, depending on the voltage level and time period of the bias voltage.

Figure 9:
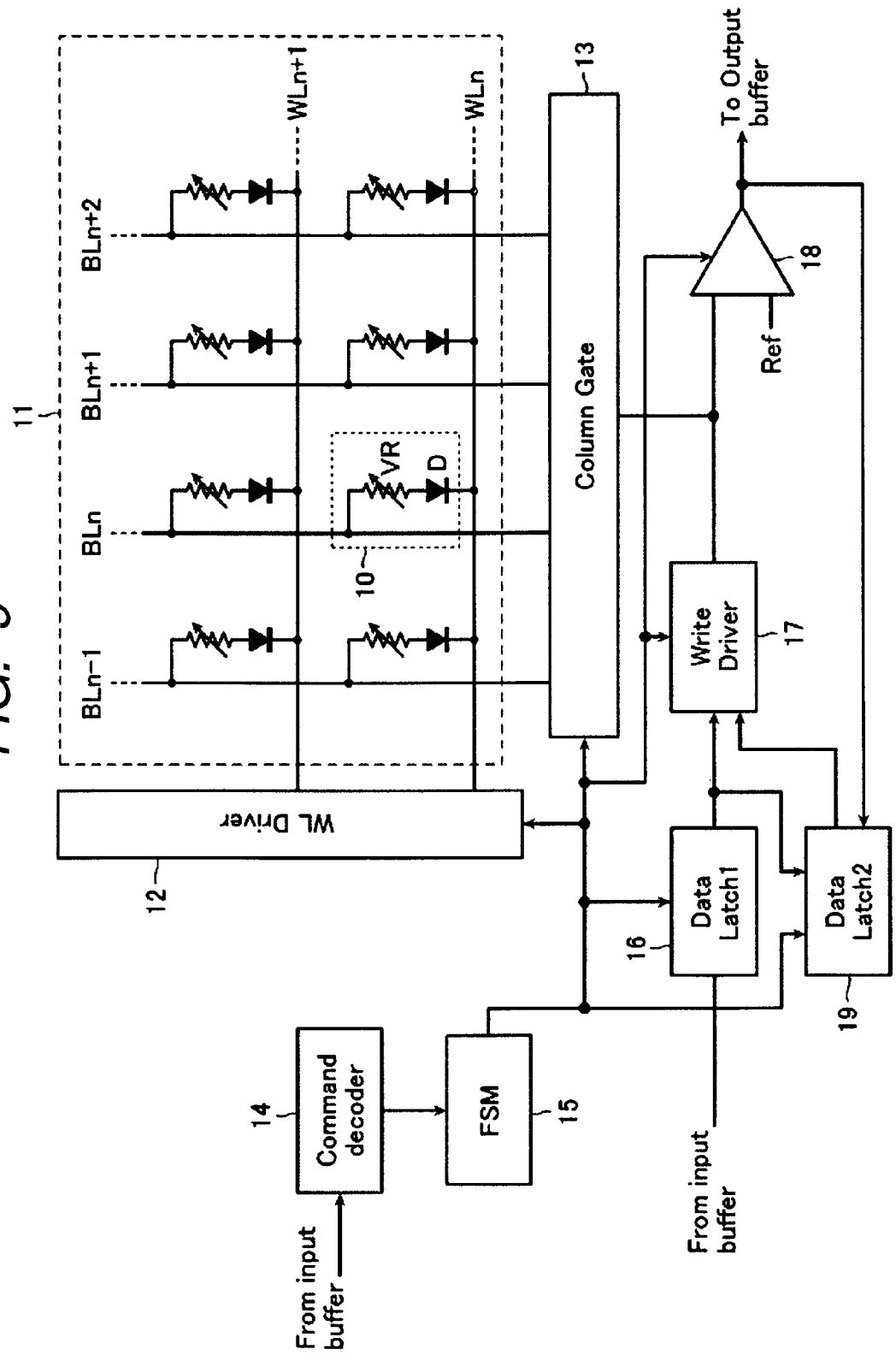
FIG. 9 is a diagram showing the configuration of functional blocks of a ReRAM according to an embodiment.

FIG. 9 shows the configuration of functional blocks of a non-volatile memory according to this embodiment capable of reducing the influence of the above-described write disturbance and erase disturbance.

The word lines WL of a cell array 11 formed by arranging memory cells 10 are selectively driven by a word line driver 12. The bit lines BL are selected by a column gate 13 and are connected to a write driver 17 and a sense amplifier 18. The write driver 17 controls voltages of the bit lines for a write or erase operation.

Figure 18:
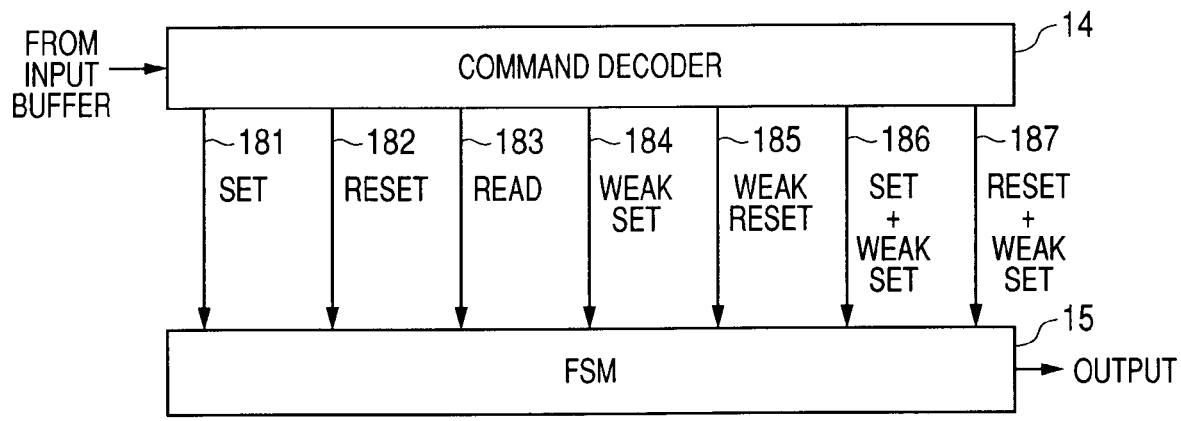
FIG. 18 is an exemplary diagram showing the connection between the command decoder and the state machine according to an embodiment.

As shown in FIG. 18, a command decoder 14 interprets various commands issued by a memory controller disposed outside the device and recognizes predetermined operation states. A state machine 15 receives output of the command decoder 14 and controls operations for write/erase/read.

For a write (set) or erase (reset) operation, a first data latch 16 receives data, for example, of one page used for a batch write or batch erase operation and maintains the data until the write or erase operation is completed. In addition to the first data latch 16, a second data latch 19 used for maintaining reference data is provided.

For example, the second data latch 19 maintains data used for a weak erase or weak write operation for compensating unselected memory cells that are affected by the write disturbance or the erase disturbance. The data of the second data latch 19 may be generated based on the data of the first data latch. Alternatively, the second data latch 19 may be used for maintaining data read out from the cell array by the sense amplifier 18, comparing the read-out data with the write data, and controlling write prohibition for a specific area.

The write driver 17 receives data states of the first and second data latches 16 and 19 under control of the state machine 15, performs a predetermined calculation, and applies a bit line voltage required for a write or erase operation at a timing required for the bit line BL.

Hereinafter, detailed write and erase methods capable of reducing the influence of the write disturbance and the erase disturbance will be described.

[First Write Method]

Figure 10:
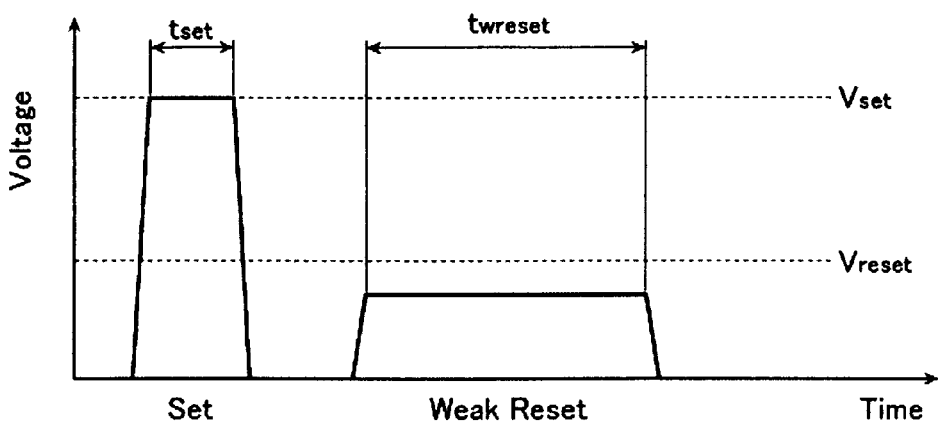
FIG. 10 is a diagram showing operational waveforms of a first write method according to an embodiment.

FIG. 10 shows the waveform of a write voltage according to a first write method. In this method, after a write (set) pulse voltage Vset having a pulse width of tset is applied to a selected memory cell, a weak erase pulse voltage Vwreset having a pulse width of twreset (twreset>tset) for compensation is applied to unselected adjacent memory cells that become a weak write state by the write operation and is affected by the disturbance. The weak erase pulse voltage Vwreset for compensation is much lower than the write voltage Vset and is lower than a normal erase pulse voltage Vreset.

At that moment, when the weak erase pulse voltage Vwreset and the pulse width twreset thereof are optimized, the unselected memory cells that are affected by the write disturbance are compensated for a part or the whole of the unnecessary variances of the resistance values, and accordingly, a desired distribution of resistance values can be acquired.

A detailed description will now be followed. Before the write operation is performed, the write data of one page is stored in the first data latch 16. At this moment, since unselected memory cells that are affected by the write disturbance can be determined in advance based on the relationship between the physical disposition of the memory cell array and the first data latch, weak erase data for compensating for the write disturbance is stored in the second data latch 19.

After a series of write initiation processes are directed by an external controller or an internal controller of the device, the state machine 15 controls application of a predetermined voltage to the word lines and the bit lines at a predetermined timing such that a write operation for the selected memory cell can be performed.

Figure 11:
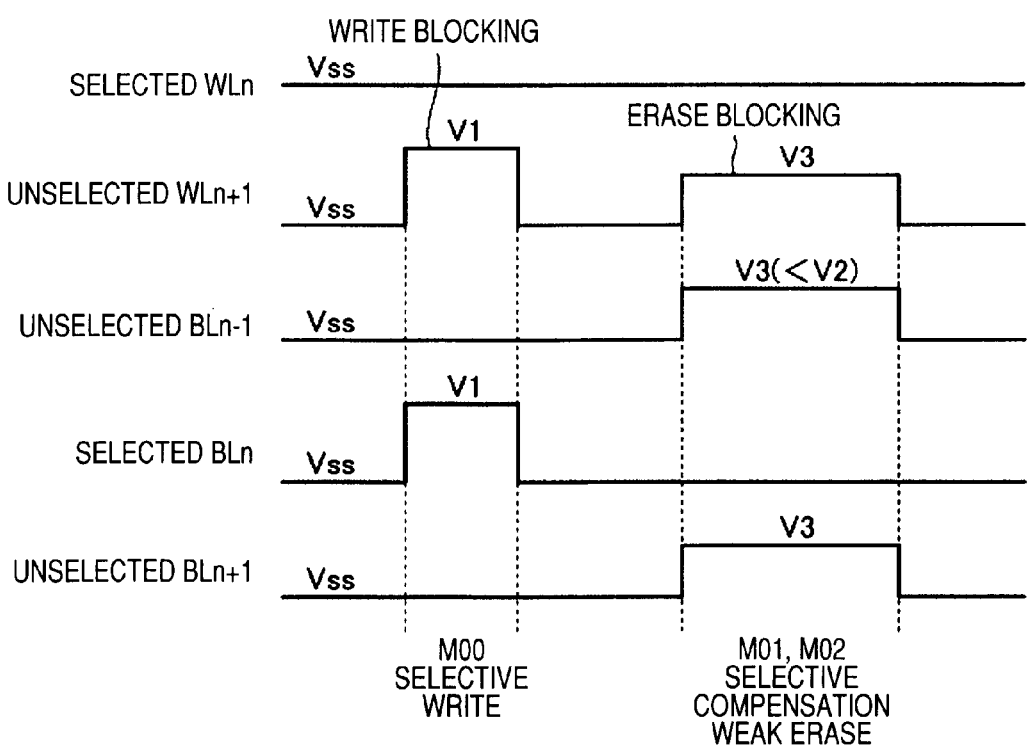
FIG. 11 show operational waveforms of a detailed application example of the first write method.

FIG. 11 shows the waveforms of a selected word line WLn, an unselected word line $WL_{n+1}$, a selected bit line BLn, and unselected bit lines $BL_{n-1}$ and $BL_{n+1}$, for example, in a case where the write data of the first data latch 16 is used for writing a memory cell M00 selected by the bit line BLn located on the word line WLn shown in FIG. 1

For writing the memory cell M00, a write bit line voltage V1 (for example, 7 V) is applied to the selected bit line BLn, a write word line voltage of 0 V is applied to the selected word line WLn, 0 V is applied to the unselected bit lines $BL_{n-1}$ and $BL_{n+1}$, and a write blocking voltage V1 is applied to the unselected word line $WL_{n+1}$. Accordingly, a required write voltage of Vset is applied to the selected memory cell M00.

After the write operation is performed, the state machine 15 controls the column gate 13 so as to select unselected adjacent memory cell, which is adjacent to the selected memory cell and shares the same WL. In other words, after the previous write operation is performed, a weak erase operation for compensating for the write disturbance is performed based on the data of the second data latch 19.

Described in more details, a weak erase bit line voltage V3 that is used for compensation and is lower than the erase bit line voltage V2 is applied to the unselected bit lines $BL_{n-1}$ and $BL_{n+1}$ positioned on both sides of the selected bit line BLn. In addition, an erase blocking voltage V3 having the same voltage level as the weak erase bit line voltage is applied to the unselected word line WLn. Accordingly, a required weak erase pulse voltage Vwreset is applied to the unselected memory cells M01 and M02 that are affected by the write disturbance, and accordingly, a weak erase operation for compensation is performed.

In FIGS. 10 and 11, although one write pulse and one weak erase pulse are shown, however, the pulses may be divided into a plurality of pulses to be applied. In addition, the shape of the pulses may be changed in the voltage level based on the characteristics. After the pulse is applied, a verified read operation in which whether the resistance value of the memory cell has reached a predetermined value is checked may be performed. All the control operations are performed by the state machine 15.

As described above, by using the write sequence, the influence of the write disturbance on the unselected cells adjacent to the word line on which the write-selected cell is located can be removed.

When selection methods by using the bit lines and the word lines is different, there is a case where an operation for compensating unselected adjacent cells located on the bit line, on which the selected cell is located, for write disturbance is needed to be performed. In such a case, by configuring to change the selection of a word line by using the word line driver 12 instead of changing the selection of a bit line by using the column gate 13, a weak erase operation for compensating unselected adjacent cells for the write disturbance can be performed similarly.

[First Erase Method]

Figure 12:
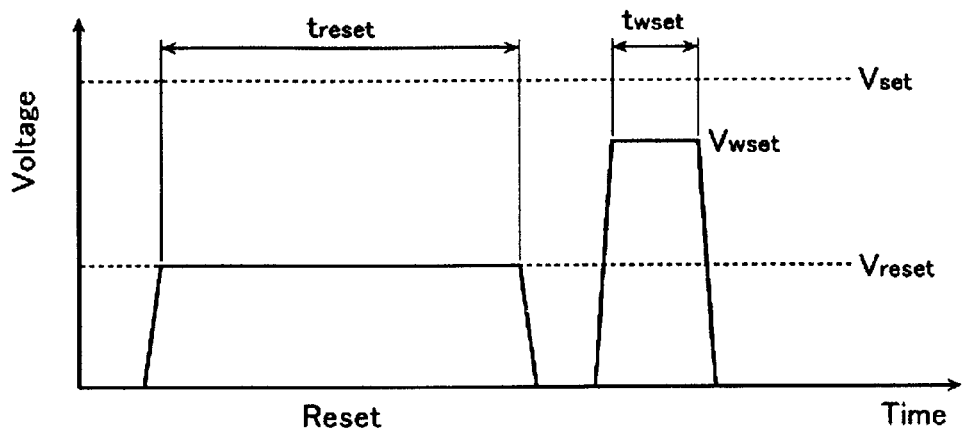
FIG. 12 is a diagram showing operational waveforms of a first erase method according to an embodiment.

FIG. 12 shows the waveform of an erase voltage according to a first erase method. In this method, after an erase (reset) pulse voltage Vreset having a predetermined pulse width treset is applied to the selected memory cell, a weak write pulse voltage Vwset having a pulse width twset (treset>twset), which is used for compensating for a part or the whole of the unnecessary variances of the resistance values, is applied to unselected adjacent memory cells that become the weak erase state in accordance with the erase operation and are affected by the disturbance. The weak write pulse voltage Vwset for compensation is much lower than the write voltage Vset and is lower than a normal erase pulse voltage Vreset.

Figure 13:
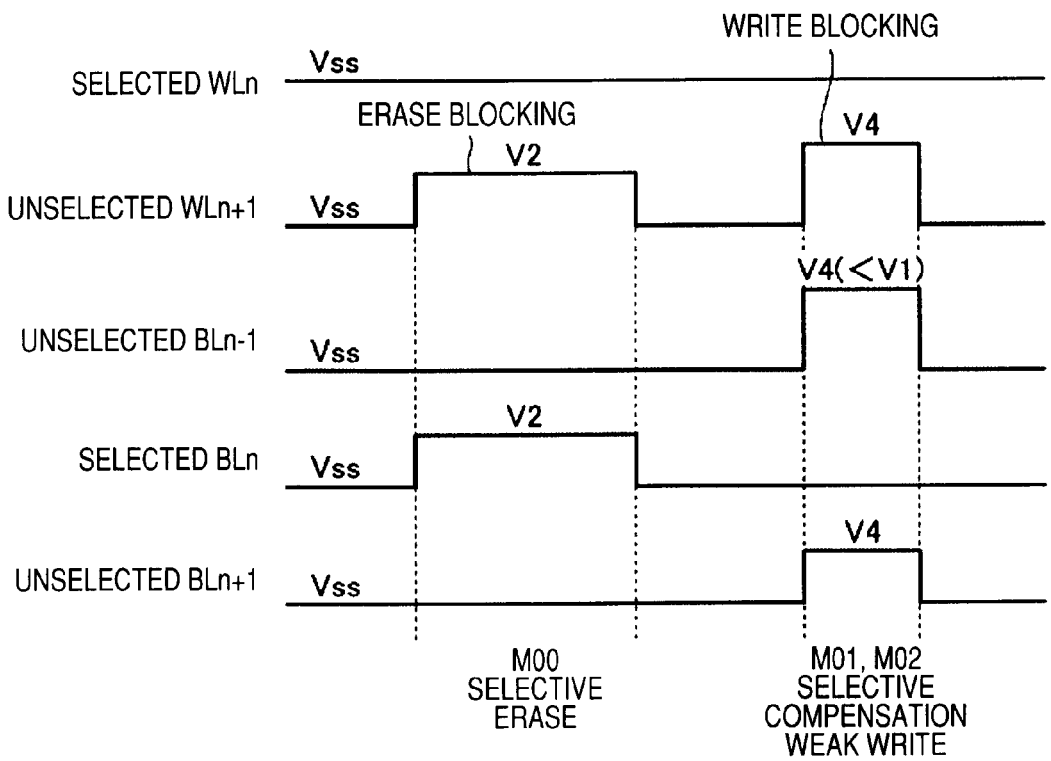
FIG. 13 shows operational waveforms of a detailed application example of the first erase method.

FIG. 13 shows the waveforms of a selected word line WLn, an unselected word line $WL_{n+1}$, a selected bit line BLn, and unselected bit lines $BL_{n-1}$ and $BL_{n+1}$ in a case where an erase operation is performed for a memory cell M00 selected by the bit line BLn located on the word line WLn shown in FIG. 1.

For erasing the memory cell M00, an erase bit line voltage V2 is applied to the selected bit line BLn, an erase word line voltage of 0 V is applied to the selected word line WLn, 0 V is applied to the unselected bit lines $BL_{n-1}$ and $BL_{n+1}$, and an erase blocking voltage V2 is applied to the unselected word line $WL_{n+1}$. Accordingly, a required erase voltage of Vreset is applied to the selected memory cell M00.

After the erase operation is performed, a weak write operation for compensating for the erase disturbance is performed based on the data of the second data latch 19. In other words, a weak write bit line voltage V4 (<V1) used for compensation is applied to the unselected bit lines $BL_{n-1}$ and $BL_{n+1}$ positioned on both sides of the selected bit line BLn, and a write blocking voltage V4 having a same voltage level as the weak write bit line voltage is applied to the unselected wordline WLn. Accordingly, the needed weak write voltage Vwset is applied to the unselected memory cells M01 and M02 that are affected by the erase disturbance, and accordingly, a weak write operation for compensation is performed.

As described above, unselected adjacent memory cells located on the word line, on which the selected memory cell of the selected word line is located, can be compensated for the erase disturbance.

[Second Write Method]

Figure 14:
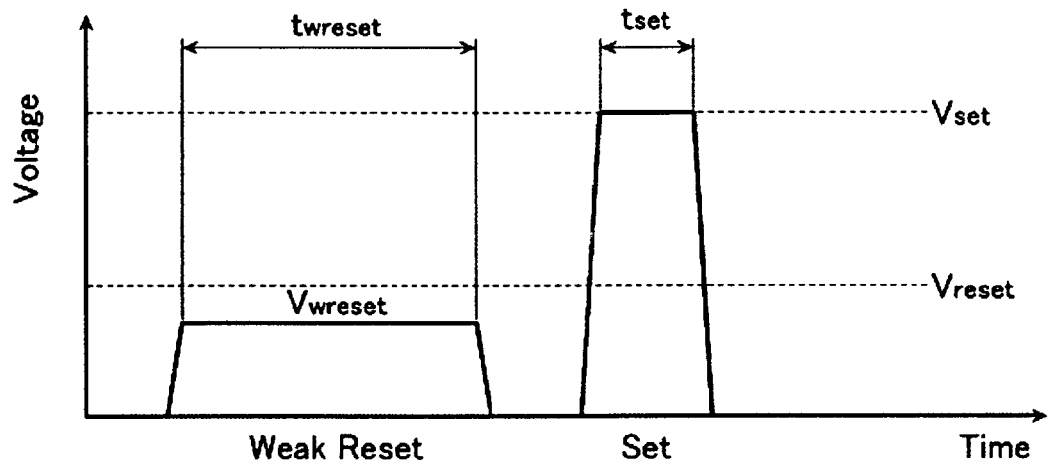
FIG. 14 is a diagram showing operational waveforms of a second write method according to an embodiment.

In the first write method described above, the order of application of the write (set) pulse and application of the weak erase pulse for compensation may be reversed. In other words, instead of applying voltage shown in FIG. 10, the voltage waveform shown in FIG. 14 is applied. Before the write operation is performed, a weak erase operation for compensating for the disturbance due to the write operation is performed based on the data of the second data latch 19 (a pulse voltage of Vwrest and a pulse width of twrest). Thereafter, a write operation is performed in accordance with the data of the first data latch 16 (a pulse voltage of Vset and a pulse width of tset).

As described above, by assuming that memory cells are affected by the write disturbance and by performing a weak erase operation so as to decrease the distribution of the resistance values of the memory cells by an amount equivalent to that of the possible disturbance, the distribution of the resistance values after completion of the write operation can be set to be equivalent to a case without the disturbance.

[Second Erase Method]

Figure 15:
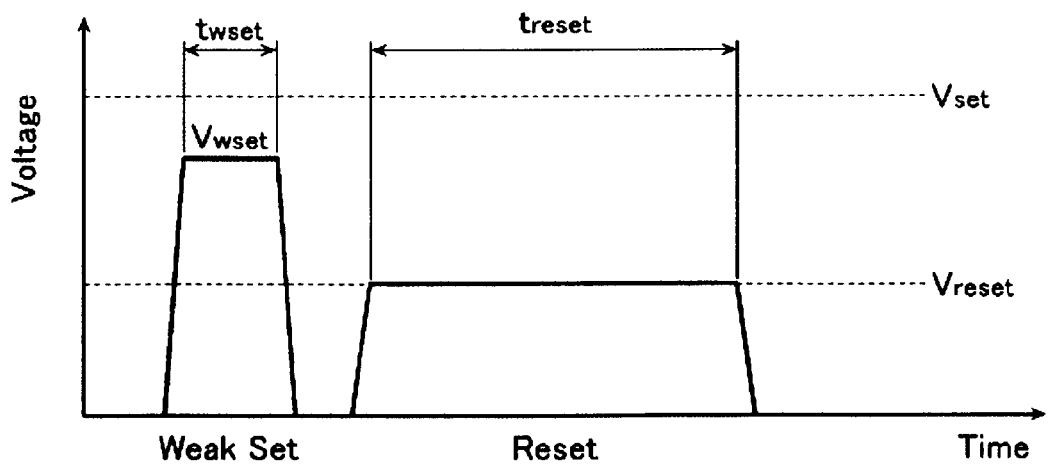
FIG. 15 is a diagram showing operational waveforms of a second erase method according to an embodiment.

In the first erase method described above, the order of application of the erase (reset) pulse and application of the weak write pulse for compensation may be reversed. In other words, instead of applying voltage shown in FIG. 12, the voltage waveform shown in FIG. 15 is applied. Before the erase operation is performed, a weak write operation for compensating for the disturbance occurred due to the erase operation is performed based on the data of the second data latch 19 (a pulse voltage of Vwset and a pulse width of twset). Thereafter, an erase operation is performed in accordance with the data of the first data latch 16 (a pulse voltage of Vreset and a pulse width of treset).

As described above, by assuming that memory cells are affected by the erase disturbance and by performing a weak write operation so as to increase the distribution of the resistance values of the memory cells by an amount equivalent to that of the possible disturbance, the distribution of the resistance values after completion of the erase operation can be set to be equivalent to a case without the disturbance.

Until now, for the unselected memory cells that are affected by the write/erase disturbance, a weak erase operation/a weak write operation for compensation is performed afterward or beforehand. On the contrary, there is a technique for reducing the disturbance without performing an additional weak erase or weak write operation. Such examples will be described as below

[Third Write/Erase Method]

When a data overwriting operation or the like is performed for a page of a group of memory cells, it is possible to control write or erase prohibition so as not to perform an unnecessary write/erase operation within one page by using a combination of data of one page for overwriting and data read out from the cell array. Accordingly, unnecessary write/erase disturbance can be suppressed.

A detailed example will now be described with reference to FIGS. 16(a)-(c). Here, an example in which one page of the group of memory cells selected by one word line is configured by 16 bits is shown. The overwriting data shown in FIG. 16(a) is loaded in the first data latch 16. The read-out data shown in FIG. 16(b) is resulted from reading out data already written in the page to be overwritten from a cell array, and the read-out data is maintained in the second data latch 19.

By combining each bit of the first and second data latches 16 and 19, the output of the write driver 17 is set as shown in FIG. 16(c). In other words, for bits (b0, b2, b9, b11, b12, and b14) of which read-out data is "1" and write data is "0", write (set) is set. In addition, for bits (b8 and b10) of which read-out data is "0" and write data is "1", erase (reset) is set.

For bits (b1, b3, and b4 to b7) of which read-out data is "0" and write data is "0", an unnecessary additional write operation is performed, and accordingly, write (set) prohibition is set (* mark). Similarly, for bits (b13 and b15) of which read-out data is "1" and write data is "1", an unnecessary additional erase operation is performed, and accordingly, erase (reset) prohibition is set (* mark).

When a write (set) or erase (reset) operation is performed without reference to the second data latch, voltage application for bits to which a voltage is not needed to be applied is performed. However, as described above, in an overwriting state, by setting write prohibition (no-write) or erase prohibition (no-erase) for bits for which an unnecessary additional write operation or an unnecessary additional erase operation is performed, unnecessary application of a write/erase pulse can decrease. Accordingly, it is possible to reduce the disturbance.

[Fourth Write/Erase Method]

Assume that one page is logically divided into even and odd addresses, and the even address data is written in advance and the odd is thereafter. In this case, the resistance distribution of even address which is already programmed is affected when the odd address is programmed.

Given that bit lines BLn and $BL_{n+2}$ are logically assigned to even addresses, bit lines $BL_{n-1}$ and $BL_{n+1}$ are logically assigned odd addresses, and bit lines assigned to even addresses and bit lines assigned to odd addresses are arranged alternately, when a write voltage (for example V1) is applied to the bit line $BL_{n+1}$ and a write blocking voltage (for example, 0 V) is applied to the physically adjacent bit lines BLn and $BL_{n+2}$ of even addresses in a case where a write operation for the bit line $BL_{n+1}$ of an odd address is performed, a rise of the write blocking voltage due to capacitive coupling between adjacent bit lines is predicted. In such a case, the write blocking voltage may rise up to a weak write voltage, depending on the strength of the capacitive coupling. In such a case, an erroneous write operation may be performed.

In order to avoid the above-described situation, written even-address data is read out in advance of writing an odd-address data. Then a batch erase operation for the corresponding whole page is performed. After then, the even-address data and odd-address data are written simultaneously.

In particular, a description thereof will be followed with reference to FIGS. 17(a)-(e). Here, a case where one page is configured by 16 bits is shown. FIG. 17(a) shows a data state before the write operation for a corresponding page, and it is assumed that all the data states are "1". In the state, first, even-address write data shown in FIG. 17(b) is loaded in the first data latch 16.

Subsequently, odd-address write data shown in FIG. 17(c) is loaded in the first data latch 16. In this state, an odd-address write operation is waited, and the already written even-address data is read out from the cell array and maintained in the second data latch 19 as shown in FIG. 17(c).

Thereafter, a batch erase operation is performed for the entire cells of the corresponding page, and then, the odd-address data of the first data latch 16 and the even-address data of the second data latch 19 are written simultaneously. Accordingly, a cell data state shown in FIG. 17(e) is acquired.

Accordingly, the disturbance for write data which occurs in a case where even-address data and the odd-address data are separately written can be avoided. In such a case, a write operation, a read out operation, and an erase operation are performed with respect to the already written even-address data when the write operation for odd-address data is performed later on. Therefore, the even-address data may be regarded as refreshed.

The above-described technique can be generalized as below. In a case where a write operation is performed for a part of a group of cells which share a word line, when the remaining part is already written, the data for the remaining part is read out, and data of the entire cells is erased at once. Then, a write operation for the entire cells is performed based on the data input from outside of the device and the read-out data.

Accordingly, the disturbance can be reduced without performing a weak write operation or a weak erase operation for compensation.

The present invention is not limited to the above-described embodiments. For example, in the above-described embodiments, a case where the distribution of the resistance values is stored as binary data by using two states including a high-resistance state and a low-resistance state has been described. However, multi-value data such as quad data or octal data can be stored by arranging an additional intermediate resistance value state.

In addition, in the above-described embodiments, a case where a constant voltage is applied for the write operation or the erase operation has been shown. However, a static current applying method or a voltage-current combining application method may be used depending on the material of the memory device.

In the above-described embodiments, an example in which the write blocking voltage V1 (FIG. 11), the erase blocking voltage V3 (FIG. 11), and the write blocking voltage V4 (FIG. 12) have electric potential differences of zero from the unselected bit line has been described. However, the present invention is not limited thereto, and other appropriate voltages may be selected.

In addition, the write (set), erase (reset), read, weak write (w/set), and weak erase (w/reset) operations may be performed by controlling a control section including the word line driver 12, the column gate 13, the data latch 16, the write driver 17 and the data latch 19 by the state machine 15.

As shown in FIG. 18, the command decoder 14 may have control lines 181 to 185 and may output signals corresponding to the set, the reset, the read, the w/set and the w/reset operation to the state machine 15 respectively through the control lines 181 to 185. Further, the command decoder 14 may have additional control lines to output a signal corresponding to a combined operation such as "set and w/reset operation" and "reset and W/set operation", to the state machine 15.

Figure 19:
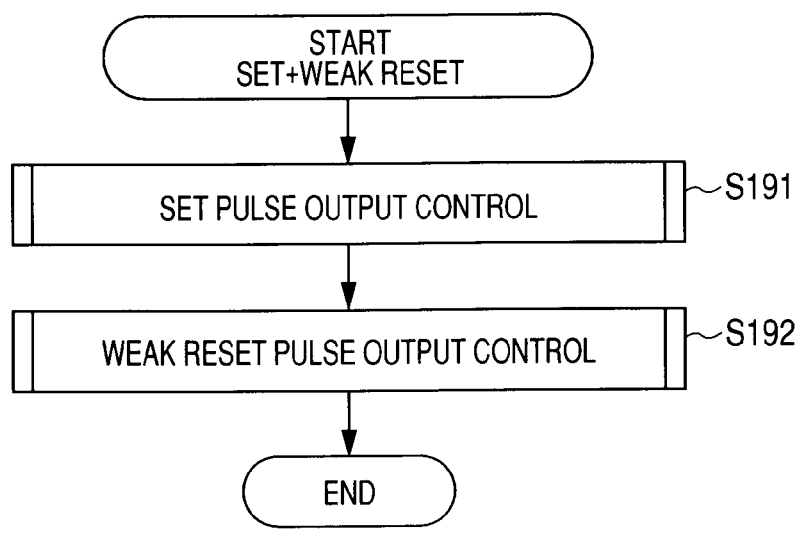
FIG. 19 is an example flow chart showing the procedure of set and weak reset operation.

The state machine 15 controls the control section so as to apply a predetermined pulse voltage to the cell array 11 according to an output of the command decoder 14. FIG. 19 is an exemplary flow chart showing an operation of the state machine 15 when the state machine 15 receives the signal corresponding to "set and w/reset" operation from the command decoder 14. After a command of "set and w/reset" is input to the command decoder 14, the command decoder outputs an output corresponding to "set and w/reset" to the state machine 15, and then the state machine controls the control section so as to apply a set pulse voltage to a given cell array (S191). Next, the state machine controls the control section so as to apply weak reset pulse voltage to the given cell array (S192). The combination of the operations of "set and w/reset" is described here, but not limited to.

Figure 20:
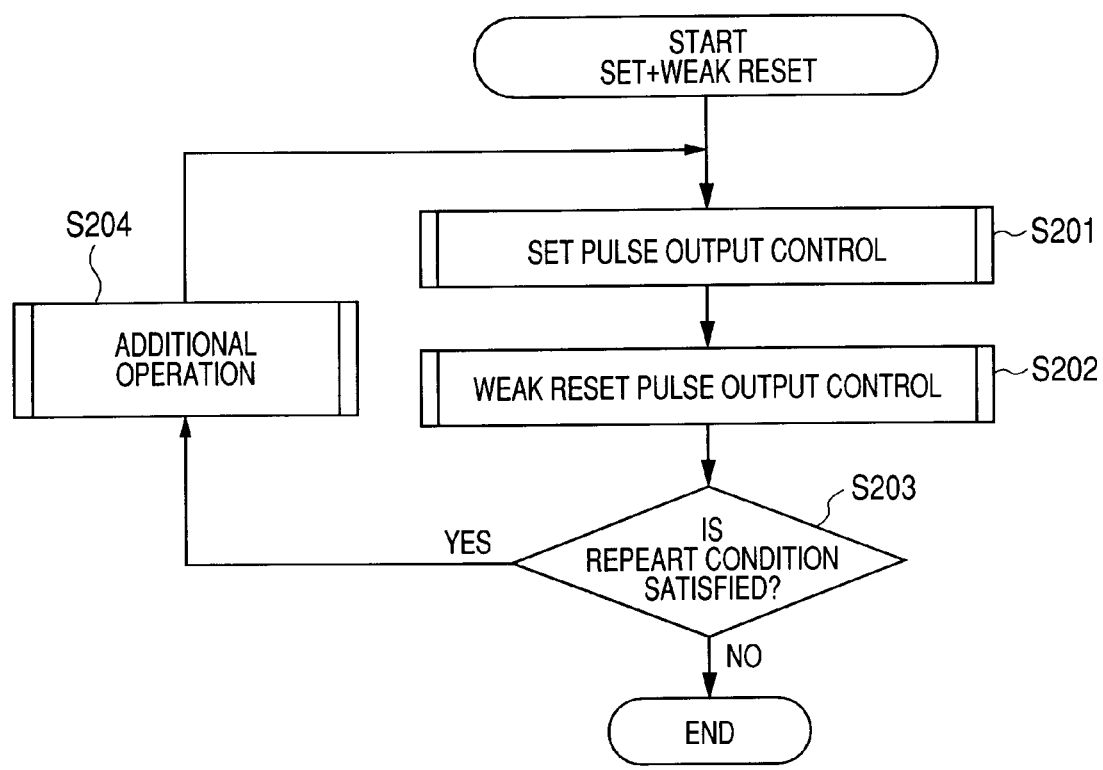
FIG. 20 is another example flow chart showing the procedure of set and weak reset operation.

In addition, the state machine 15 may set a conditional branch in order to perform a processing repeatedly. FIG. 20 is an exemplary flow chart showing an operation of the state machine 15, to which such a conditional branch is added, when the state machine 15 receives the signal corresponding to "set and w/reset" operation from the command decoder 14. FIG. 20 shows that the state machine 15 controls the control section so as to apply a set pulse voltage to a given cell array (S201). Next, the state machine controls the cell array control member so as to apply weak reset pulse voltage to the given cell array (S202). And then, the state machine determines whether the repeat condition is satisfied. If the repeat condition is satisfied, the state machine operates an additional operation and goes back to the beginning of the flowchart. If the repeat condition is set as "the result of verify is no good", the writing will be repeated until the writing is successfully performed. A continuous writing is also possible by setting the additional operation as "setting an address of the cell array to be written next time".

In FIGS. 18 to 20, the state machine controlling the cell array control member is shown. However, a controller placed outside of the memory may control the cell array control member.

As described with reference to the embodiment, there is provided a non-volatile memory device capable of suppressing write or erase disturbance.

According to the embodiment, there is provided a non-volatile memory device capable of suppressing write or erase disturbance.

What is claimed is:

1. A nonvolatile memory device comprising:
   a memory cell array including memory cells each having a variable resistance element for nonvolatilely storing data identified by an electrically rewritable resistance value;
   a first data latch storing write and erase data to be written on a given group of memory cells of the memory cell array for a write and erase operation;
   a second data latch storing reference data for performing a compensation operation of the given group to compensate write and erase disturbance accompanied by the write or erase operation;
   wherein the second data latch stores data read from the given group of memory cells, and
   wherein the write and erase operations include controlling operations based on prohibition of an additional write and prohibition of an additional erase for a given bit that is identified by a comparison between the data stored in the first data latch and the second data latch.

2. The nonvolatile memory device according to claim 1, wherein the reference data includes data used for a weak erase or weak write operation performed for compensating unselected memory cells that are affected by the write and erase disturbance when the write or erase operation is performed based on the data stored in the first data latch, and
   wherein, after the write or erase operation based on the data stored in the first data latch is performed, the weak erase or weak write operation for compensating the unselected memory cells is performed based on data stored in the second data latch.

3. The nonvolatile memory device according to claim 2, wherein weak erase voltage applied to the memory cell in the weak erase operation is lower than erase voltage applied to the memory cell in the erase operation, and
   wherein time of applying the weak erase voltage to the memory cell in the weak erase operation is longer than time of applying the write voltage when the write operation.

4. The nonvolatile memory device according to claim 2, wherein weak write voltage applied to the memory cell in the weak write operation is lower than write voltage applied to the memory cell in the write operation, and
   wherein time of applying the weak write voltage to the memory cell when the weak write operation is shorter than time of applying the erase voltage in the erase operation.

5. The nonvolatile memory device according to claim 1, wherein the compensation data includes data used for a weak erase or weak write operation performed for compensating unselected memory cells that are affected by the write and erase disturbance when the write or erase operation is performed based on the data stored in the first data latch, and
   wherein, in advance of the write or erase operation based on the data stored in the first data latch is performed, the weak erase or weak write operation for compensating the unselected memory cells is performed based on data stored in the second data latch.

6. The nonvolatile memory device according to claim 5, wherein weak erase voltage applied to the memory cell in the weak erase operation is lower than erase voltage applied to the memory cell in the erase operation, and
   wherein time of applying the weak erase voltage to the memory cell when the weak erase operation is longer than time of applying the write voltage in the write operation.

7. The nonvolatile memory device according to claim 5, wherein weak write voltage applied to the memory cell in the weak write operation is lower than write voltage applied to the memory cell in the write operation, and
   wherein time of applying the weak write voltage to the memory cell when the weak write operation is shorter than time of applying the erase voltage in the erase operation.

8. The nonvolatile memory device according to claim 1, wherein the memory cell array has row-direction wirings and column-direction wirings that intersect each other, and
   wherein the memory cell is configured by stacking a variable resistance element and a rectifying device at each intersection of the row-direction wirings and the column-direction wirings.

9. The nonvolatile memory device according to claim 1 further comprising a state machine configured to apply given voltages to the memory cell,
   wherein the state machine performs the write operation, the erase operation, and the compensation operation for write or erase disturbance.

10. The nonvolatile memory device according to claim 9, wherein the state machine repeatedly performs the write operation, the erase operation, and the compensation operation for write or erase disturbance.

11. A nonvolatile memory device comprising:
    a memory cell array including memory cells each having a variable resistance element for nonvolatilely storing data identified by an electrically rewritable resistance value;
    a first data latch storing a first write data stored in a part of a given group of memory cells, and
    a second data latch storing a second write data read from the given group of memory cells except the part of the given group of the memory cells,
    wherein, after the data stored in the given group of the memory cells are collectively erased, the first write data and the second write data are written on each corresponding position of the given group of memory cells.

* * * * *